United States Patent
Guldi et al.

(10) Patent No.: US 7,112,540 B2
(45) Date of Patent: Sep. 26, 2006

(54) PRETREATMENT FOR AN ELECTROPLATING PROCESS AND AN ELECTROPLATING PROCESS IN INCLUDING THE PRETREATMENT

(75) Inventors: Richard L. Guldi, Dallas, TX (US); Deepak Ramappa, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 38 days.

(21) Appl. No.: 10/766,491

(22) Filed: Jan. 28, 2004

(65) Prior Publication Data

US 2005/0164496 A1   Jul. 28, 2005

(51) Int. Cl.
*H01L 21/31* (2006.01)
*H01L 23/52* (2006.01)

(52) U.S. Cl. ........................ 438/770; 257/762
(58) Field of Classification Search ............... 257/626, 257/636, 753, 762; 438/628, 635, 644, 654, 438/677–678, 770, 788, 958, 963
See application file for complete search history.

(56) References Cited

U.S. PATENT DOCUMENTS

| | | | |
|---|---|---|---|
| 2003/0034251 A1* | 2/2003 | Chikarmane et al. | 205/125 |
| 2005/0031876 A1* | 2/2005 | Lu et al. | 428/428 |
| 2005/0064708 A1* | 3/2005 | May et al. | 438/687 |

\* cited by examiner

*Primary Examiner*—Andy Huynh
*Assistant Examiner*—Calvin Lee
(74) *Attorney, Agent, or Firm*—Jacqueline J. Garner; W. James Brady, III; Frederick J. Telecky, Jr.

(57) ABSTRACT

The present invention provides an electroplating process and a method for manufacturing an integrated circuit. The electroplating process includes, among other steps, placing a substrate 290 in an enclosure 200 being substantially devoid of unwanted contaminants and forming a material layer 310 over the substrate 290 within the enclosure 200, the enclosure 200 still being substantially devoid of the unwanted contaminants. The electroplating process further includes forming a thin layer of oxide 410 over the material layer 310 within the enclosure 200, the enclosure 200 still being substantially devoid of the unwanted contaminants during the forming the thin layer of oxide 410.

12 Claims, 6 Drawing Sheets

PRETREATMENT FOR AN ELECTROPLATING PROCESS AND AN ELECTROPLATING PROCESS IN INCLUDING THE PRETREATMENT

TECHNICAL FIELD OF THE INVENTION

The present invention is directed, in general, to a pretreatment for an electroplating process and, more specifically, to an electroplating process including the pretreatment.

BACKGROUND OF THE INVENTION

The trend toward smaller microelectronic devices, such as those with sub-micron geometries, has resulted in devices with multiple metallization layers to handle the higher densities of circuit elements. One common metal used for forming metal lines on a semiconductor wafer, also referred to as wiring, is aluminum. Aluminum has the advantage of being relatively inexpensive, having low resistivity, and being relatively easy to etch. Aluminum has also been used to form interconnections in vias to connect the different metal layers. However, as the size of via/contact holes shrinks to the sub-micron region, a step coverage problem emerges, which in turn can cause reliability problems when using aluminum to form the interconnections between the different metal layers. Such poor step coverage results in high current density and enhances electromigration.

One approach to providing improved interconnection paths in the vias is to form completely filled plugs by using metals such as tungsten, while using aluminum for the metal layers. However, tungsten processes are expensive and complicated, tungsten has high resistivity, and tungsten plugs are susceptible to voids and form poor interfaces with the wiring layers.

Therefore, copper has been proposed as a replacement material for interconnect metallizations. Copper has the advantages of improved electrical properties as compared to tungsten, as well as better electromigration and lower resistivity as compared to aluminum. The drawbacks to copper are that it is more difficult to etch as compared to aluminum and tungsten, and it has a tendency to migrate into the dielectric layer, such as silicon dioxide. To prevent such migration, a barrier layer, such as titanium nitride, tantalum nitride and the like, must be used prior to the depositing of a copper layer.

Typical techniques for applying a copper layer, such as electrochemical deposition, are generally only suitable for applying copper to an electrically conductive layer. Thus, an underlying conductive seed layer, typically a metal seed layer such as copper, is generally applied to the barrier layer prior to electrochemically depositing copper. Such seed layers may be applied by a variety of methods, such as physical vapor deposition (PVD) and chemical vapor deposition (CVD). Typically, seed layers are thin in comparison to other metal layers, such as from 5 nm to 150 nm thick.

While the copper seed layer improves the adhesion of the electroplated copper layer to the barrier layer, it also introduces a surface upon which an oxide can grow prior to electroplating the main copper layer. Such an oxide forms from exposure of the metal seed layer to oxygen, such as air. The longer the seed layer is exposed to oxygen, the greater the amount of oxide formation.

It was originally believed that any oxide that formed on the surface of the copper seed layer interfered with subsequent copper electroplating. For example it was believed that any oxide layer on the copper seed layer would cause voids to form in the electroplated copper layer. Interestingly enough, it has recently been determined that native oxide layers formed from air are much more detrimental to the electroplated copper layer than oxides formed from pure oxygen. Actually, it has presently been observed that oxides formed from pure oxygen in fact benefit the subsequent copper electroplating. For instance, a copper seed layer having a thin, but pure, oxide layer formed thereon wets better than a copper seed layer having no oxide layer at all. Unfortunately, the process currently used to introduce the pure oxide layer onto the copper seed layer also introduces a thin native oxide into the process.

Accordingly, what is needed in the art is a method for electroplating copper that introduces an ultra-pure oxide layer over the copper seed layer without introducing a native oxide layer therebetween.

SUMMARY OF THE INVENTION

To address the above-discussed deficiencies of the prior art, the present invention provides an electroplating process and a method for manufacturing an integrated circuit. The electroplating process includes, among other steps, placing a substrate in an enclosure being substantially devoid of unwanted contaminants and forming a material layer over the substrate within the enclosure, the enclosure still being substantially devoid of the unwanted contaminants. The electroplating process further includes forming a thin layer of oxide over the material layer within the enclosure, the enclosure still being substantially devoid of the unwanted contaminants during the forming the thin layer of oxide.

As indicated above, the present invention also includes a method for manufacturing an integrated circuit. The method for manufacturing the integrated circuit includes 1) providing a semiconductor substrate having transistor devices located thereover, 2) forming a dielectric layer over the transistor devices, and 3) forming an interconnect in the dielectric layer, including creating an opening in the dielectric layer, placing the dielectric layer in an enclosure being substantially devoid of unwanted contaminants, forming a material layer in the opening within the enclosure, the enclosure still being substantially devoid of the unwanted contaminants, forming a thin layer of oxide over the material layer within the enclosure, the enclosure still being substantially devoid of the unwanted contaminants during the forming the thin layer of oxide, and removing the substrate having the thin layer of oxide from the enclosure and placing the substrate in an electroplating solution.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGURES. It is emphasized that in accordance with the standard practice in the industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
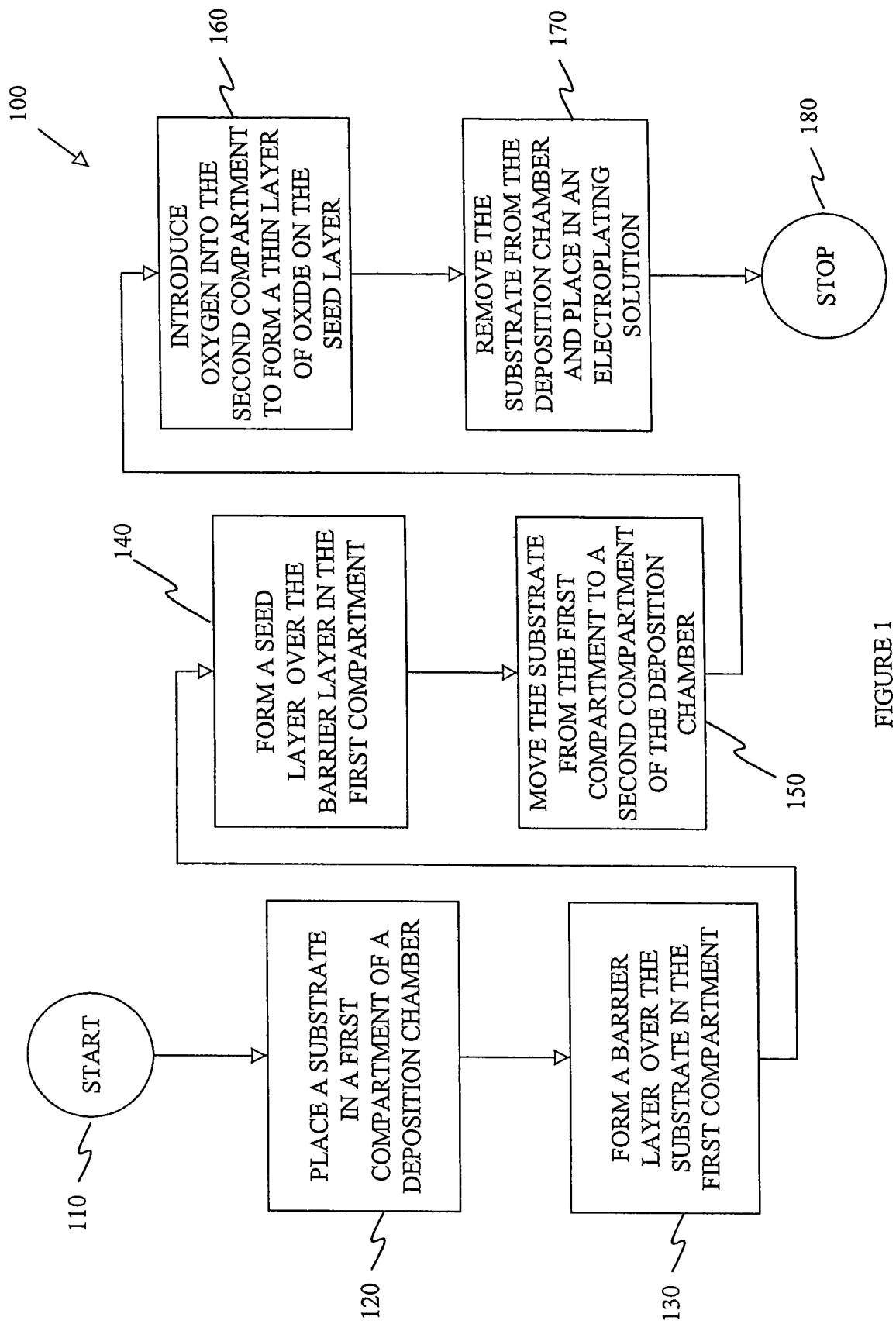
FIG. 1 illustrates a flow chart depicting steps that might be used to electroplate a metal in accordance with the principles of the present invention.

Referring initially to FIG. 1 illustrated is a flow chart 100 depicting steps that might be used to electroplate a metal in accordance with the principles of the present invention. While the flow chart 100 is depicted as having only six main steps, those skilled in the art understand that the manufacturing process may, and most times will, encompass more steps than depicted in FIG. 1. Additionally, as the flow chart 100 sets forth the steps that might be used to electroplate a single metal layer, the collection of steps could be repeated any number of times to produce any number of electroplated metal layers.

Figure 2:
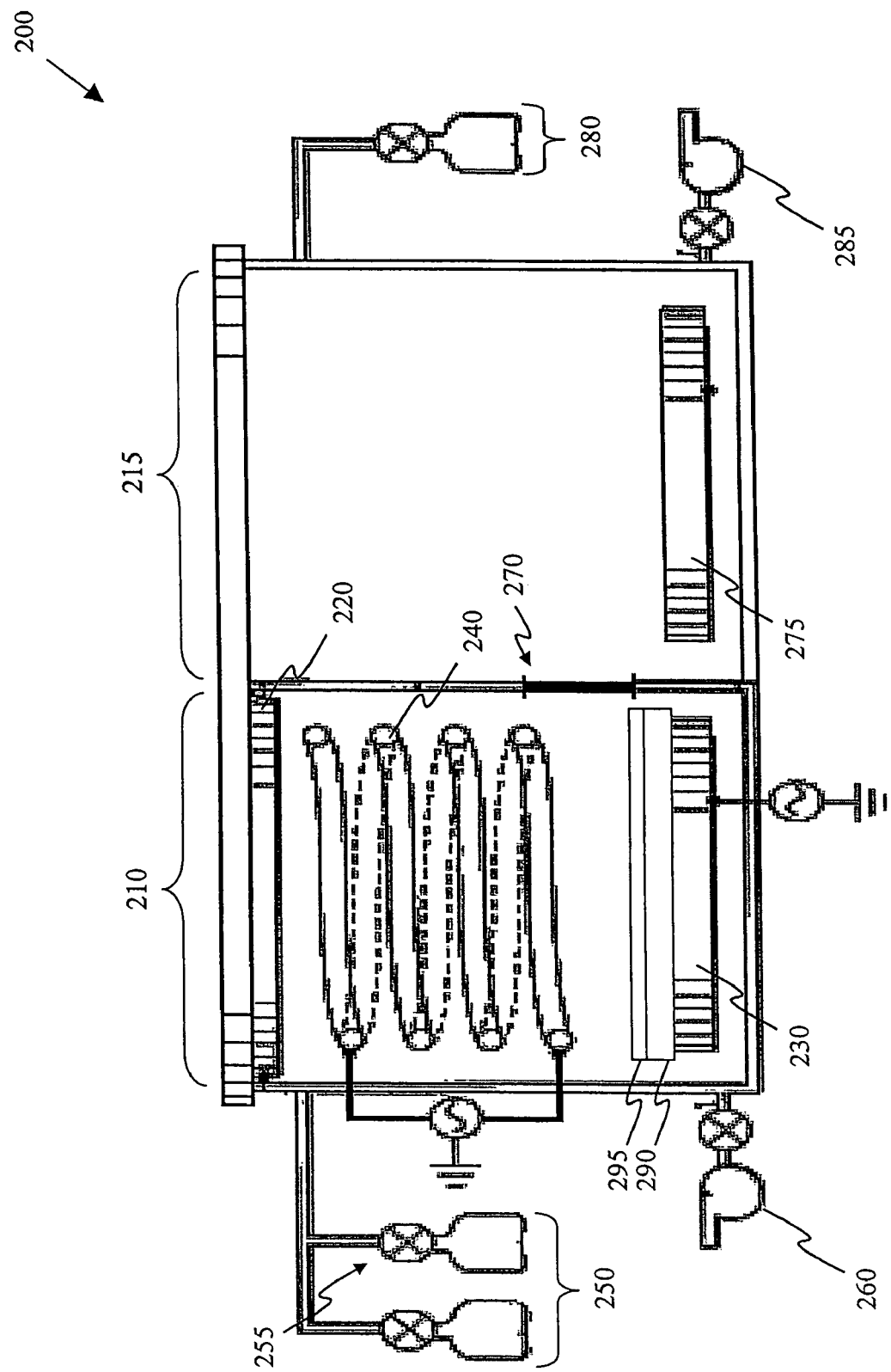
FIGS. 2–4 illustrate schematic cross-sectional views of an enclosure that might be used for electroplating a metal in accordance with the principles of the present invention.
Figure 3:
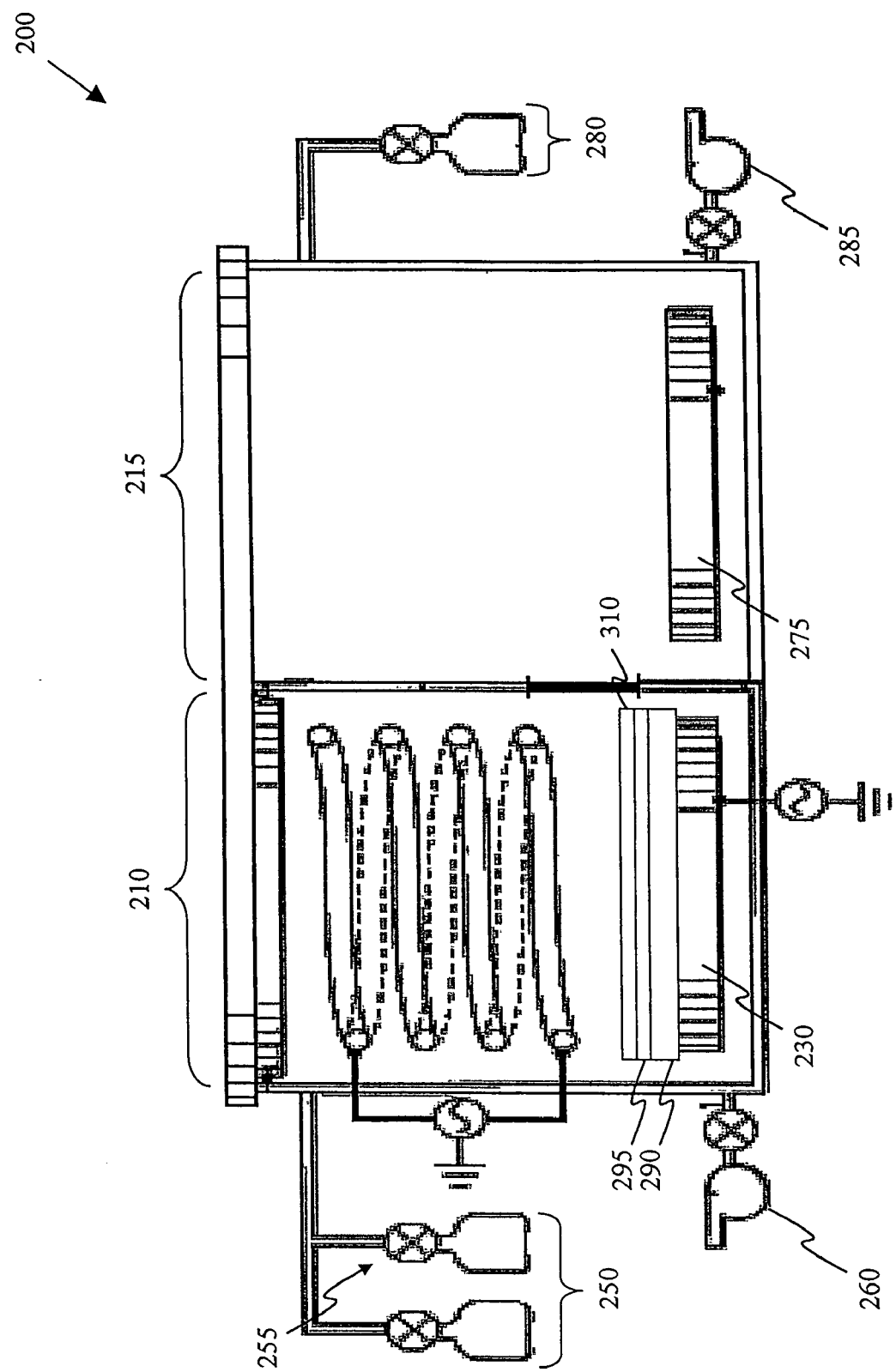
Figure 4:
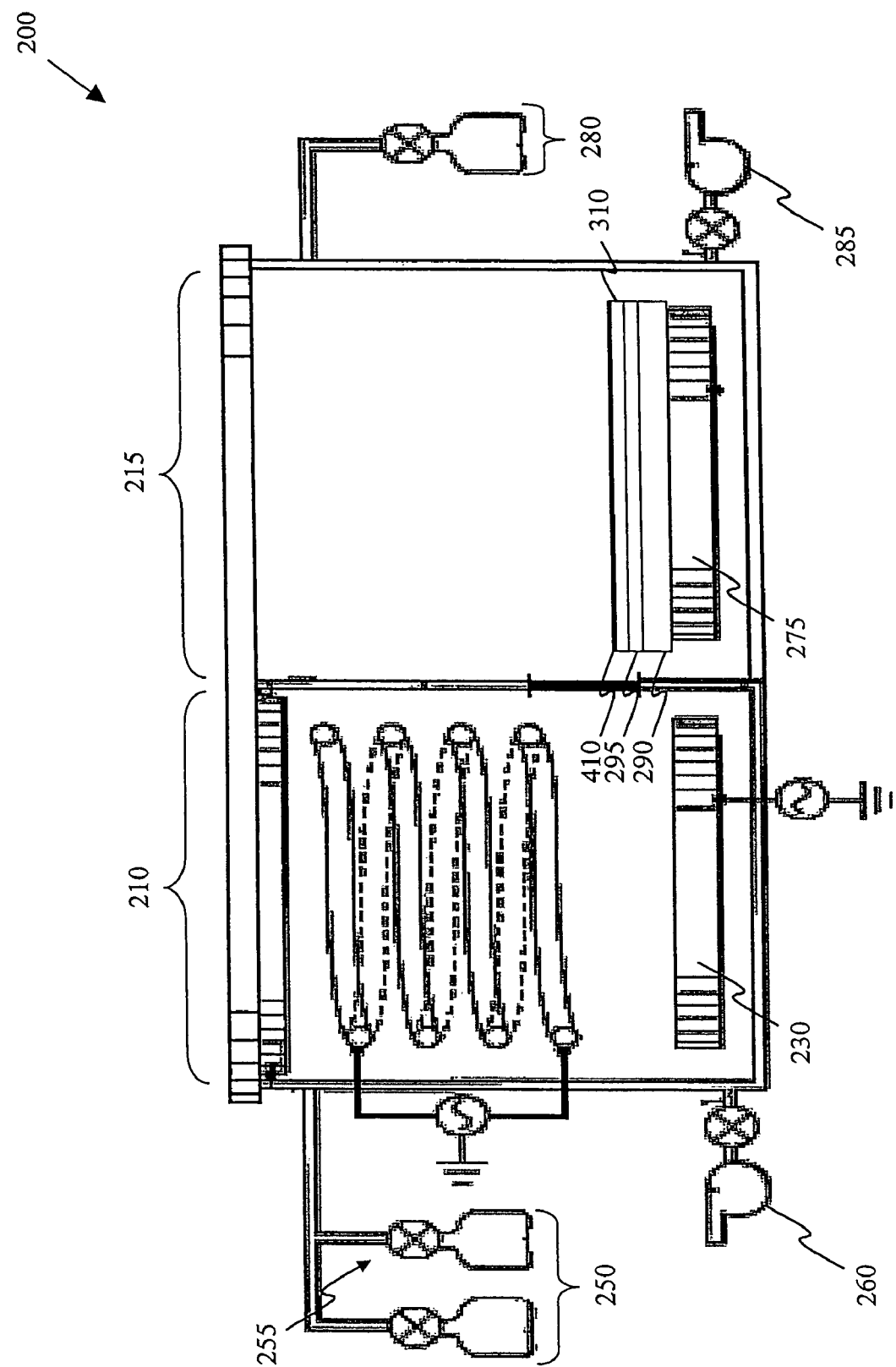

Turning now to FIGS. 2–4 illustrated are schematic cross-sectional views of an enclosure 200 that might be used in the process for electroplating a metal in accordance with the principles of the present invention. In the embodiment shown and discussed with respect to FIGS. 2–4, the enclosure 200 contains first and second compartments 210, 215. In the particular embodiment shown and discussed, the first compartment 210 comprises a deposition chamber, such as a plasma vapor deposition (PVD) chamber that might be used to deposit a barrier or seed layer in accordance with the principles of the present invention. Located within the first compartment 210 of the enclosure 200 are one or more conventional targets 220 mounted on a top wall thereof. As those skilled in the art are well aware, the conventional target 220 material will depend on the specific material being deposited. Similarly, the conventional target 220 could comprise one or more different targets to accommodate the deposition of one or more material layers within the first compartment 210.

Further located within the first compartment 210 is a substrate support 230. In the embodiment illustrated in FIGS. 2–4, the substrate support 230 is mounted parallel to and spaced from the target 220. Similarly, a coil 240 is mounted inside the first compartment 210 between the target 220 and the substrate support 230. As those skilled in the art are aware, a source of DC power would typically be connected to the target 220; and a source of RF power would typically be connected to the substrate support 230 and coil 240.

Further connected to the first compartment 210 are gas sources 250. The gas flows from the gas sources 250 may be metered to the first compartment 210 by means of flow valves 255. Additionally, connected to the first compartment 210 is a pump 260. The pump 260, such as a cryogenic pump, maintains a desired pressure in the first compartment 210.

As those skilled in the art are aware, the internal inductively coupled coil 240 provides a high density plasma in the region between the sputtering cathode or target 220 and the substrate support 230. Thus sputtered target atoms become ionized and positively charged as they pass through the high density plasma region, and therefore are attracted by the negatively biased substrate 290 (discussed below).

Connected to the first compartment 210 via a sealable opening 270 is the second compartment 215. The second compartment 215, similar to the first compartment 210, may include a substrate support 275. Furthermore, optimally connected to the second compartment 215 is a gas source 280 and pump 285. The gas source 280 supplies gas, such as pure oxygen, to the second compartment 215 while the pump 285 maintains the desired pressure within the second compartment 215.

Referring now to FIG. 1, with brief references to FIGS. 2–5, an electroplating process in accordance with the principles of the present invention begins at a start step 110. After the start step 110, in a step 120, a substrate 290 is placed within the enclosure 200. In the particular embodiment shown and discussed with respect to FIG. 2, the substrate 290 is placed within a first compartment 210 of the enclosure 200.

The substrate 290 may comprise a variety of different materials and configurations while staying within the scope of the present invention. For example, the substrate 290 could be an interlevel dielectric layer of an integrated circuit. Additionally, the substrate 290 need not be a flat surface, and hence could have an opening formed therein, such as a via or trench in an interlevel dielectric layer.

Sometime after introducing the substrate 290 into the enclosure 200, unwanted contaminants are removed therefrom. For example, one of the pumps 260, 285 could be used to take the entire enclosure 200, including any compartments that make it up, to a reduced pressure. In this instance, it is believed that the unwanted contaminants would no longer be located within the enclosure 200. Any other method could, however, be used to remove the unwanted contaminants, as long as those unwanted contaminants remain gone for an extended period.

While many contaminants might be undesirable, particularly undesirable are those contaminants such as moisture, volatile organics (from for example, vapors in the clean room ambient), ionic radicals (from for example, gases in the clean room ambient) and other similar contaminants. Among others, these include water vapor, organics like BTA vapors, toluene and ionic radicals like amines. All these readily dissolve and incorporate in oxides, thereby modifying the poly amorphous nature of the oxides.

After step 120, in a step 130, a barrier layer 295 may be formed over the substrate 290 while in the enclosure 200, and particularly in the first compartment 210 portion of the enclosure 200. The barrier layer 295 is formed while the enclosure 200 is still substantially devoid of the previously removed unwanted contaminants. The barrier layer 295, which may comprise a titanium/titanium nitride stack or a tantalum/tantalum nitride stack, among others, is typically designed to protect elements proximate the substrate 290 from the subsequently formed electroplated metal layer. If the substrate 290 were to have an opening formed therein as discussed above, the barrier layer 295 would also be formed along the sidewalls and base of the opening.

The barrier layer 295 may be formed using a number of different conventional manufacturing parameters. For instance, the barrier layer 295 may be formed using a first low pressure in the first compartment 210. Typically this first low pressure ranges from about 1.5 militorr to about 50 militorr, however, other pressures are within the scope of the present invention. As the remainder of the process for forming the barrier layer 295 is conventional, no further discussion is given.

Turning now to FIG. 3, with continued reference to FIG. 1, a material layer, such as a seed layer 310, is formed over the barrier layer 295, in a step 140. The seed layer 310, as is shown, is formed within the enclosure 200, and may be formed within the same first compartment 210 as the barrier layer 295. The seed layer 310 is also formed while the enclosure 200 is still substantially devoid of the previously removed unwanted contaminants. Advantageously, the seed layer 310 is formed without breaking a vacuum in the enclosure 200, and especially without introducing the unwanted contaminants back into the enclosure 200. The seed layer 310, which may comprise copper or another seed layer depending on the electroplated metal chosen, is typically designed to provide a good adhesive surface between the barrier layer 295 and a subsequently formed electroplated metal layer and to initiate appropriate crystal growth.

Similar to above, the seed layer 310 and its manufacture are conventional. For instance, the seed layer 310 may be formed using a second low pressure in the first chamber 210 of the enclosure 200. Typically this second low pressure ranges from about 1.5 militorr to about 50 militorr, however, other pressures are within the scope of the present invention. Often, the second low pressure and the first low pressure are substantially similar. As the remainder of the process for forming the seed layer 310 is conventional, no further discussion is given.

Turning now to FIG. 4, with continued reference to FIG. 1, the substrate 290 may be moved from the first compartment 210 to the second compartment 215, which are both within the enclosure 200, in an optional step 150. As the substrate 290, and particularly the seed layer 310 located thereon, remains within the enclosure 200 during this step, it does not come into contact with air, and thus many of the unwanted contaminants that were originally removed. As the seed layer 310 does not come into contact with air in this transfer, a native oxide does not form thereon. The term native oxide, as used herein, is an oxide formed from the oxygen present in air, which typically includes certain unwanted contaminants. In contrast, an ultra pure oxide, as used herein, is an oxide formed from oxygen other than that present in air, therefore it does not include the unwanted contaminants.

After moving the substrate 290 from the first compartment 210 to the second compartment 215, oxygen being substantially devoid of the unwanted contaminants is introduced into the second compartment 215. The oxygen, as one would expect, quickly forms a thin layer of oxide 410 on the surface of the seed layer 310. This thin layer of oxide 410, in comparison to a native oxide, is an ultra-pure oxide. What optimally results is the thin layer of oxide 410 having a thickness that ranges from about 0.5 nm to about 10 nm. Other pure gases, that is not containing the unwanted contaminants, could also be introduced into the process at this time. For example, nitrogen is often introduced with the oxygen at this time.

The oxygen may be introduced into the second compartment 215 using the gas source 280. For example, the gas source 280 might provide a flow of oxygen ranging from about 1 sccm to about 10 sccm for a time period ranging from about 5 seconds to about 60 seconds. Additionally, the second compartment 215 might be held at a low pressure ranging from about 1.5 militorr to about 50 militorr while forming the thin layer of oxide 410. Similarly, the second compartment 215 may advantageously be heated to a temperature ranging from about −10° C. to about 120° C. while forming the thin layer of oxide 410.

It should be noted that the optional step 150 could very easily be dispensed with by introducing the oxygen into the first compartment 210 rather than the second compartment 215. In such an instance, one or both of the gas source 280 or pump 285 would be connected to the first compartment 210 for providing the required environment for the thin layer of oxide 410 to form. If this was to occur, it would be very important that all of the oxygen be removed from the first compartment 210 during most of the other manufacturing steps. Particularly, it would be important to remove any remaining oxygen from the first compartment 210 prior to undertaking steps 120, 130, and 140. If this scenario were chosen, a single compartment deposition chamber could be used for steps 120, 130, 140 and 160. Similarly, the three compartment enclosure could be used to form the barrier layer 295, material layer 310 and thin layer of oxide 410, respectively.

Figure 5:
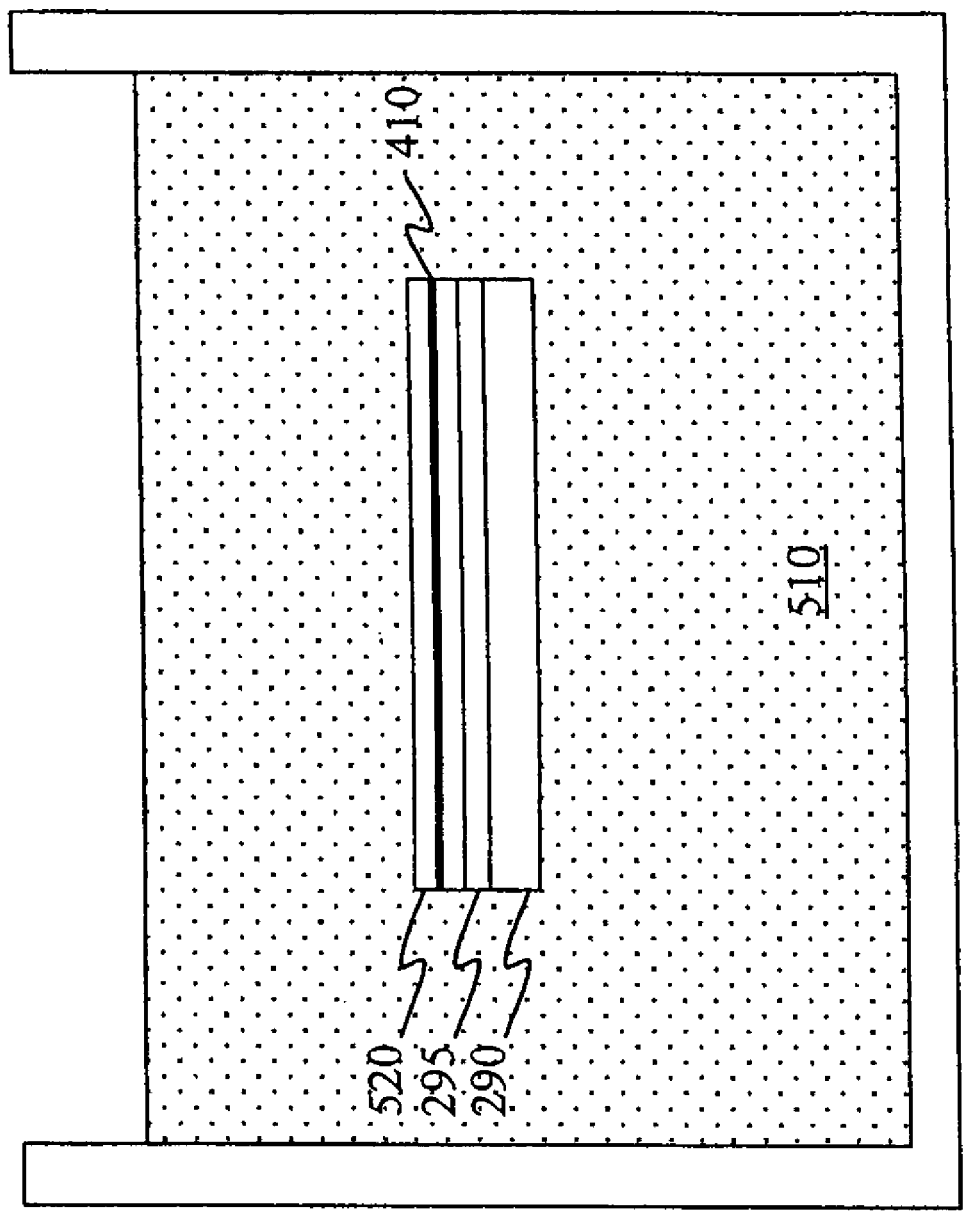
FIG. 5 illustrates a substrate being submerged in an electroplating solution.

Turning now to FIG. 5, with continued reference to FIG. 1, after completing step 160, the substrate 290, having the barrier layer 295, seed layer 310 and thin layer of oxide 410 thereon, would be removed from the enclosure 200 and placed within a conventional electroplating solution 510. As shown in FIG. 5, the electroplating solution, which could be a copper electroplating solution among others, causes an electroplated metal layer 520 to form over the thin layer of oxide 410. As the formation of the electroplated metal layer 520 is conventional, no further details will be given.

An important recognition of the present invention is that an ultra-pure oxide layer formed on a seed layer prior to removing the seed layer from the enclosure provides a better surface to electroplate to than an oxide layer having at least a portion of its make-up being a native oxide layer. For example, the introduction of the thin layer of oxide on the seed layer prior to removing the seed layer from the enclosure increases the wetting of the electroplating solution, as well as protects the seed layer from attack from airborne contaminants. It is believed that this, in effect, renders the metal layers up to about 1000 times less susceptible to void formation. Also, the present invention creates a pristine thin layer of oxide on the seed layer prior to reintroducing the unwanted contaminants. Therefore, one may not require special storage in a process or holding tank outside of the enclosure. Further, the present method can handle equipment breakdown situations better than the prior art methods.

Figure 6:
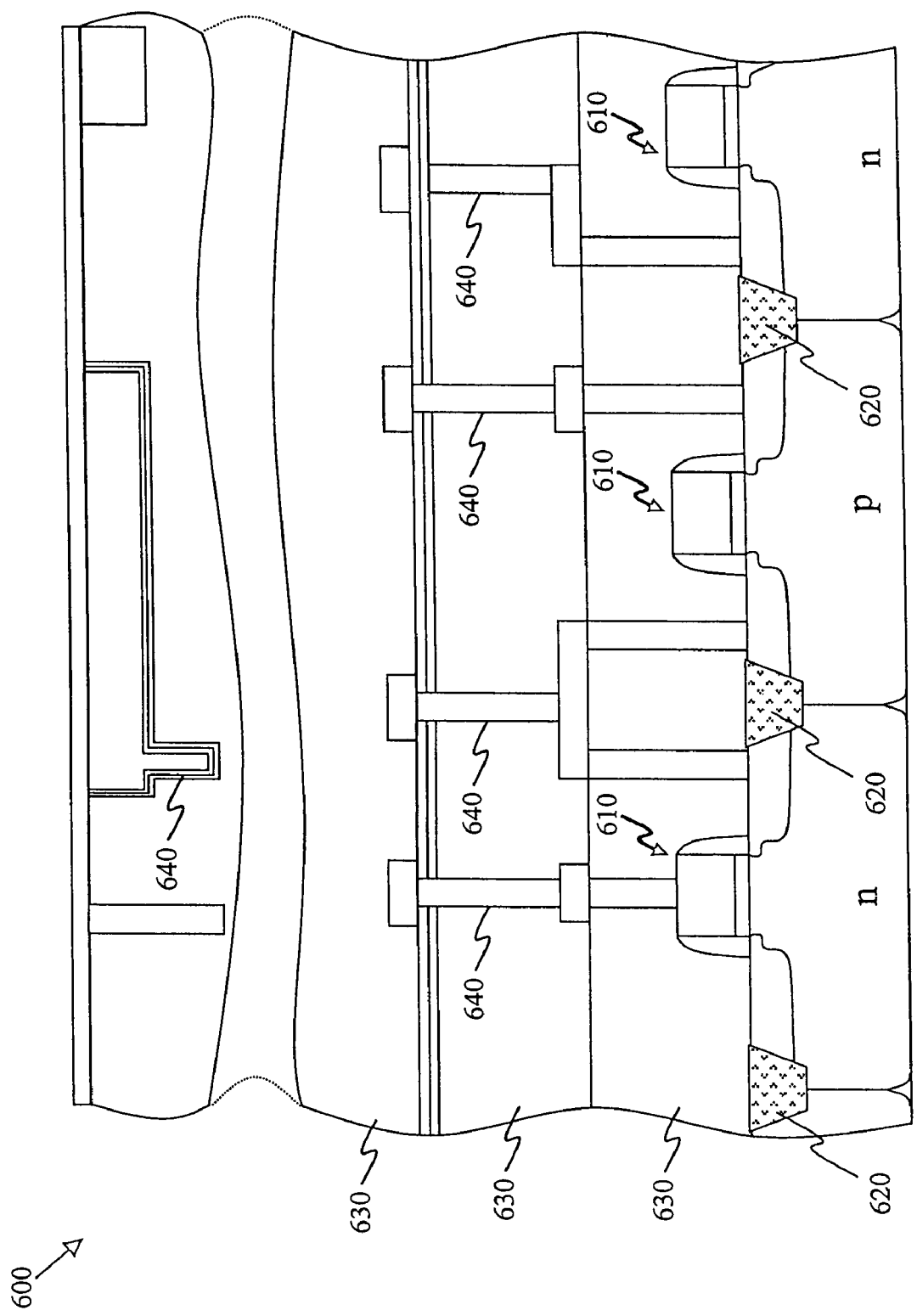
FIG. 6 illustrates a cross-sectional view of an integrated circuit (IC) incorporating an interconnect manufactured in accordance with the principles of the present invention.

Referring finally to FIG. 6, illustrated is a cross-sectional view of an integrated circuit (IC) 600 incorporating an interconnect manufactured in accordance with the principles of the present invention. The IC 600 may include devices, such as transistors used to form CMOS devices, BICMOS devices, Bipolar devices, or other types of devices. The IC 600 may further include passive devices, such as inductors or resistors, or it may also include optical devices or optoelectronic devices. Those skilled in the art are familiar with these various types of devices and their manufacture.

In the particular embodiment illustrated in FIG. 6, the IC 600 includes transistor devices 610 located between isolation structures 620. The IC 600 of FIG. 6 further includes dielectric layers 630 located over the transistor devices 610. In accordance with the principles of the present invention, interconnects 640 are located within the dielectric layers 630. The interconnects 640, as those skilled in the art are aware, may be manufactured using the electroplating process discussed with respect to FIGS. 1–5.

Although the present invention has been described in detail, those skilled in the art should understand that they can make various changes, substitutions and alterations herein without departing from the spirit and scope of the invention in its broadest form.

What is claimed is:

1. An electroplating process, comprising:
   placing a substrate in an enclosure;
   forming a seed layer over said substrate within said enclosure, said enclosure being substantially devoid of unwanted contaminants;
   forming a thin layer of oxide over said seed layer within said enclosure, said enclosure still being substantially devoid of said unwanted contaminants during said forming said thin layer of oxide;
   removing said substrate from said enclosure after forming said thin layer of oxide over said seed layer; and
   placing said substrate and said thin layer of oxide in an electroplating solution.

2. The process as recited in claim 1 wherein said electroplating solution is a copper electroplating solution.

3. The process as recited in claim 1 further including forming a barrier layer over said substrate within said enclosure prior to forming said seed layer, said enclosure still being substantially devoid of said unwanted contaminants.

4. The process as recited in claim 3 wherein said enclosure includes at least 3 compartments, and wherein said barrier layer is formed in a first compartment, said seed layer is formed in a second compartment, and said thin layer of oxide is formed in a third compartment.

5. The process as recited in claim 3 wherein said enclosure includes at least 2 compartments, and wherein said seed layer and said barrier layer are formed in a first compartment and said thin layer of oxide is formed in a second compartment.

6. The process as recited in claim 1 wherein said seed layer is a copper seed layer.

7. The process as recited in claim 1 wherein forming said seed layer over said substrate includes forming said seed layer over said substrate at a first low pressure ranging from about 1.5 militorr to about 50 militorr.

8. The process as recited in claim 1 wherein forming said thin layer of oxide over said seed layer within said enclosure includes introducing pure oxygen into said enclosure thereby forming said thin layer of oxide.

9. The process as recited in claim 1 wherein forming said thin layer of oxide over said seed layer within said enclosure includes forming said thin layer of oxide having a thickness ranging from about 0.5 nm to about 10 nm.

10. The process as recited in claim 1 wherein forming said thin layer of oxide over said seed layer within said enclosure includes forming a thin layer of oxide at a temperature ranging from about $-10°$ C. to about $150°$ C.

11. The process as recited in claim 1 wherein placing said substrate in said enclosure includes placing said substrate in said enclosure containing said unwanted contaminants and removing said unwanted contaminants from said enclosure.

12. The process as recited in claim 11 wherein said unwanted contaminants are selected from the group consisting of:
    moisture;
    volatile organics; and
    ionic radicals.

* * * * *